US008325069B2

(12) United States Patent
Gopal et al.

(10) Patent No.: US 8,325,069 B2
(45) Date of Patent: Dec. 4, 2012

(54) SYSTEM, METHOD, AND APPARATUS FOR A SCALABLE PROCESSOR ARCHITECTURE FOR A VARIETY OF STRING PROCESSING APPLICATIONS

(75) Inventors: Vinodh Gopal, Westborough, MA (US); Gilbert M. Wolrich, Framingham, MA (US); Christopher F. Clark, Chandler, AZ (US); Wadji K. Feghali, Boston, MA (US)

(73) Assignee: Intel Corporation, Santa Clara, CA (US)

( * ) Notice: Subject to any disclaimer, the term of this patent is extended or adjusted under 35 U.S.C. 154(b) by 524 days.

(21) Appl. No.: 12/645,392

(22) Filed: Dec. 22, 2009

(65) Prior Publication Data
US 2011/0154169 A1 Jun. 23, 2011

(51) Int. Cl.
*H03M 7/34* (2006.01)
*H03M 7/38* (2006.01)

(52) U.S. Cl. ............... 341/51; 341/65; 341/67; 341/87
(58) Field of Classification Search .................. 341/51, 341/65, 67, 87
See application file for complete search history.

(56) References Cited

U.S. PATENT DOCUMENTS

| 5,805,086 | A * | 9/1998 | Brown et al. ............... 341/51 |
| 6,271,775 | B1 * | 8/2001 | Jaquette et al. ............ 341/87 |
| 6,693,567 | B2 * | 2/2004 | Cockburn et al. .......... 341/51 |
| 7,538,695 | B2 * | 5/2009 | Laker et al. ............... 341/51 |
| 7,692,561 | B2 * | 4/2010 | Biran et al. ............... 341/51 |

* cited by examiner

*Primary Examiner* — Khai M Nguyen
(74) *Attorney, Agent, or Firm* — Blakely, Sokoloff, Taylor & Zafman LLP

(57) ABSTRACT

Systems, methods, and apparatus for a scalable processor architecture for variety of string processing application are described. In one such apparatus, n input first in, first out (FIFO) buffer stores an input stream. A plurality of memory banks store data from the input stream. A re-configurable controller processes the input stream. And an output FIFO buffer stores the processed input stream.

19 Claims, 11 Drawing Sheets

|  | Extra |  |  | Extra |  |  | Extra |  |
|---|---|---|---|---|---|---|---|---|
| Code | Bits | Length(s) | Code | Bits | Lengths | Code | Bits | Length(s) |
| 257 | 0 | 3 | 267 | 1 | 15,16 | 277 | 4 | 67-82 |
| 258 | 0 | 4 | 268 | 1 | 17,18 | 278 | 4 | 83-98 |
| 259 | 0 | 5 | 269 | 2 | 19-22 | 279 | 4 | 99-114 |
| 260 | 0 | 6 | 270 | 2 | 23-26 | 280 | 4 | 115-130 |
| 261 | 0 | 7 | 271 | 2 | 27-30 | 281 | 5 | 131-162 |
| 262 | 0 | 8 | 272 | 2 | 31-34 | 282 | 5 | 163-194 |
| 263 | 0 | 9 | 273 | 3 | 35-42 | 283 | 5 | 195-226 |
| 264 | 0 | 10 | 274 | 3 | 43-50 | 284 | 5 | 227-257 |
| 265 | 1 | 11,12 | 275 | 3 | 51-58 | 285 | 0 | 258 |
| 266 | 1 | 13,14 | 276 | 3 | 59-66 |  |  |  |

(a)

|  | Extra |  |  | Extra |  |  | Extra |  |
|---|---|---|---|---|---|---|---|---|
| Code | Bits | Dist | Code | Bits | Dist | Code | Bits | Distance |
| 0 | 0 | 1 | 10 | 4 | 33-48 | 20 | 9 | 1025-1536 |
| 1 | 0 | 2 | 11 | 4 | 49-64 | 21 | 9 | 1537-2048 |
| 2 | 0 | 3 | 12 | 5 | 65-96 | 22 | 10 | 2049-3072 |
| 3 | 0 | 4 | 13 | 5 | 97-128 | 23 | 10 | 3073-4096 |
| 4 | 1 | 5,6 | 14 | 6 | 129-192 | 24 | 11 | 4097-6144 |
| 5 | 1 | 7,8 | 15 | 6 | 193-256 | 25 | 11 | 6145-8192 |
| 6 | 2 | 9-12 | 16 | 7 | 257-384 | 26 | 12 | 8193-12288 |
| 7 | 2 | 13-16 | 17 | 7 | 385-512 | 27 | 12 | 12289-16384 |
| 8 | 3 | 17-24 | 18 | 8 | 513-768 | 28 | 13 | 16385-24576 |
| 9 | 3 | 25-32 | 19 | 8 | 769-1024 | 29 | 13 | 24577-32768 |

SYSTEM, METHOD, AND APPARATUS FOR A SCALABLE PROCESSOR ARCHITECTURE FOR A VARIETY OF STRING PROCESSING APPLICATIONS

FIELD OF THE INVENTION

Embodiments of the invention relate generally to the field of information processing and, more specifically, to the field of string processing.

BACKGROUND

There are a variety of string processing techniques and hardware designs. One such string processing technique is the popular lossless data compression algorithm LZ77. One of the applications of LZ77 is the DEFLATE compressed data format as specified by RFC 1951. DEFLATE is a sliding window based algorithm that compresses common substrings of characters with references in a large sliding window of history.

In DEFLATE a compressed data set consists of a series of blocks, corresponding to successive blocks of input data. The block sizes are arbitrary, except that non-compressible blocks are limited to 65,535 bytes. Each block is compressed using a combination of the LZ77 algorithm and Huffman coding. The Huffman trees for each block are independent of those for previous or subsequent blocks and the LZ77 algorithm may use a reference to a duplicated string occurring in a previous block, up to 32K input bytes before.

Each block consists of two parts: a pair of Huffman code trees that describe the representation of the compressed data part, and a compressed data part. (The Huffman trees themselves are compressed using Huffman encoding.) The compressed data consists of a series of elements of two types: literal bytes (of strings that have not been detected as duplicated within the previous 32K input bytes), and pointers to duplicated strings, where a pointer is represented as a pair <length, backward distance>. The representation used limits distances to 32K bytes and lengths to 258 bytes, but does not limit the size of a block, except for uncompressible blocks, which are limited as noted above.

Each type of value (literals, distances, and lengths) in the compressed data is represented using a Huffman code, using one code tree for literals and lengths and a separate code tree for distances. The code trees for each block appear in a compact form just before the compressed data for that block.

BRIEF DESCRIPTION OF THE DRAWINGS

Embodiments of the invention are illustrated by way of example, and not by way of limitation, in the figures of the accompanying drawings and in which like reference numerals refer to similar elements and in which

FIG. 4 illustrates the DEFLATE tables.

DETAILED DESCRIPTION

Figure 1:
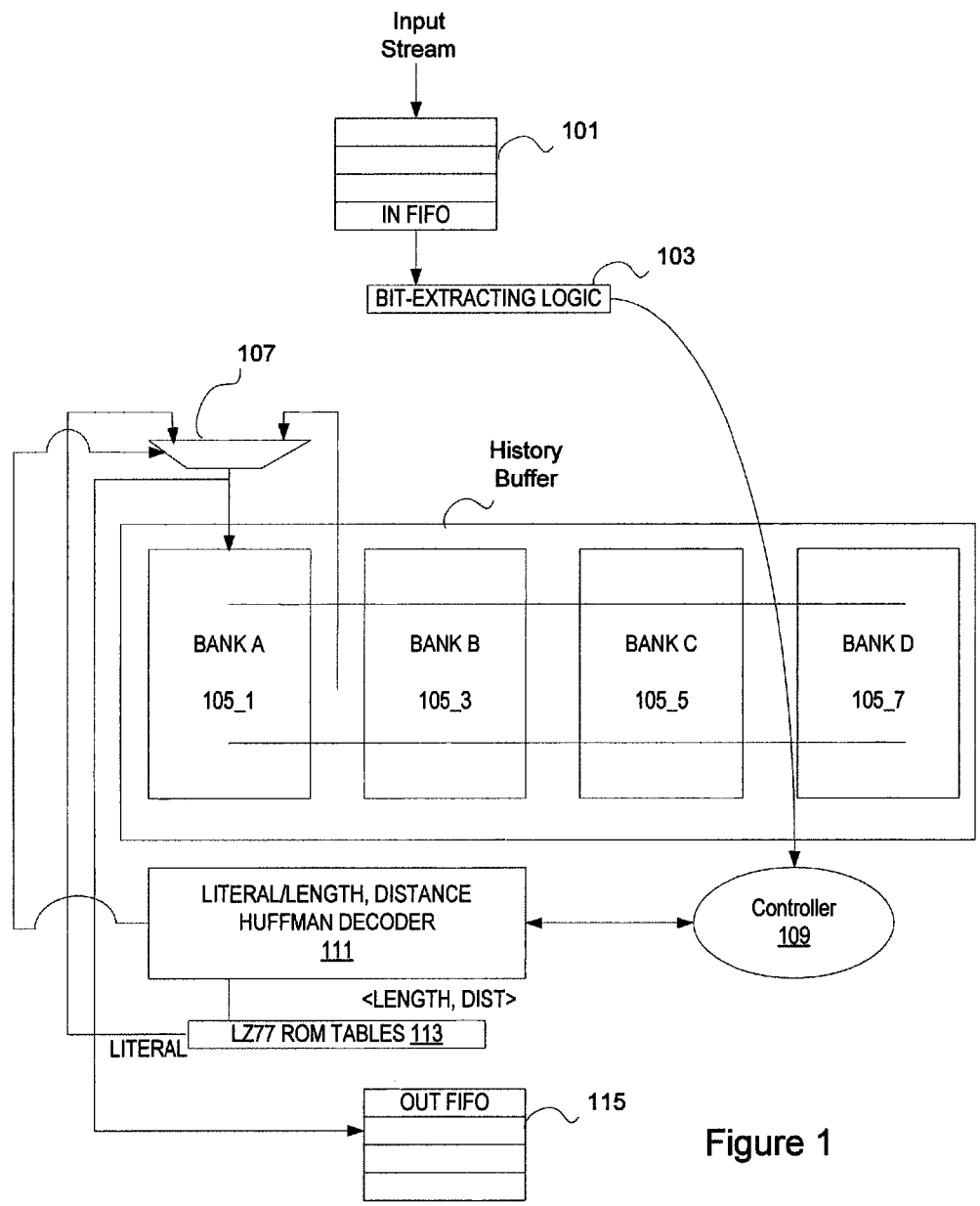
FIG. 1 illustrates an embodiment of components for performing data decompression of a compressed stream including decompression according to DEFLATE.

FIG. 1 illustrates an embodiment of components for performing data decompression of a compressed stream including decompression according to DEFLATE. However, one or more of the components may be re-tasked such that the components perform another type of decompression. Additionally, one or more of the components may be combined or further split up.

An input FIFO buffer 101 receives and buffers the compressed data. Bit-extracting logic 103 extracts bits from the input FIFO 101. The bit-extracting logic 103 may also put bits back into the FIFO 101 or other location if they are not used in a portion of the decompression process (discussed later).

A history buffer 105 is made up of several banks of memory 105_1 to 105_7. The history buffer 105 is a circular buffer that stores previously decoded literals from the input stream. In an embodiment, each bank is an 8 kB RAM thus making a 32 KB history buffer.

A re-configurable controller 109 receives bits from the bit-extracting logic and passes them to a decoder 111. The controller 109 controls the decompression process including, in an embodiment, controlling the actions of the bit-extracting logic 103. The controller also maintains read/write pointers for the banks of the history buffer 105 and has logic to maintain word registers to enable the collection of bytes before performing a write to the memory banks.

The decoder 111 uses LZ77 tables 113 to decode either <length, distance> pairs or literals from the input stream. In some embodiments, the decoder includes different Huffman tables of symbols in RAM. These tables are index addressable and the indexes may be created by the decoder itself or the controller 109. In an embodiment, the decoder includes a 4 kB table.

Finally, the components include a copy unit 107 to copy either a decoded literal or bytes from history buffer locations into the history buffer 105. The copy unit 107 also sends a copy of the literal or bytes from the history buffer to the output FIFO 115.

Figure 2:
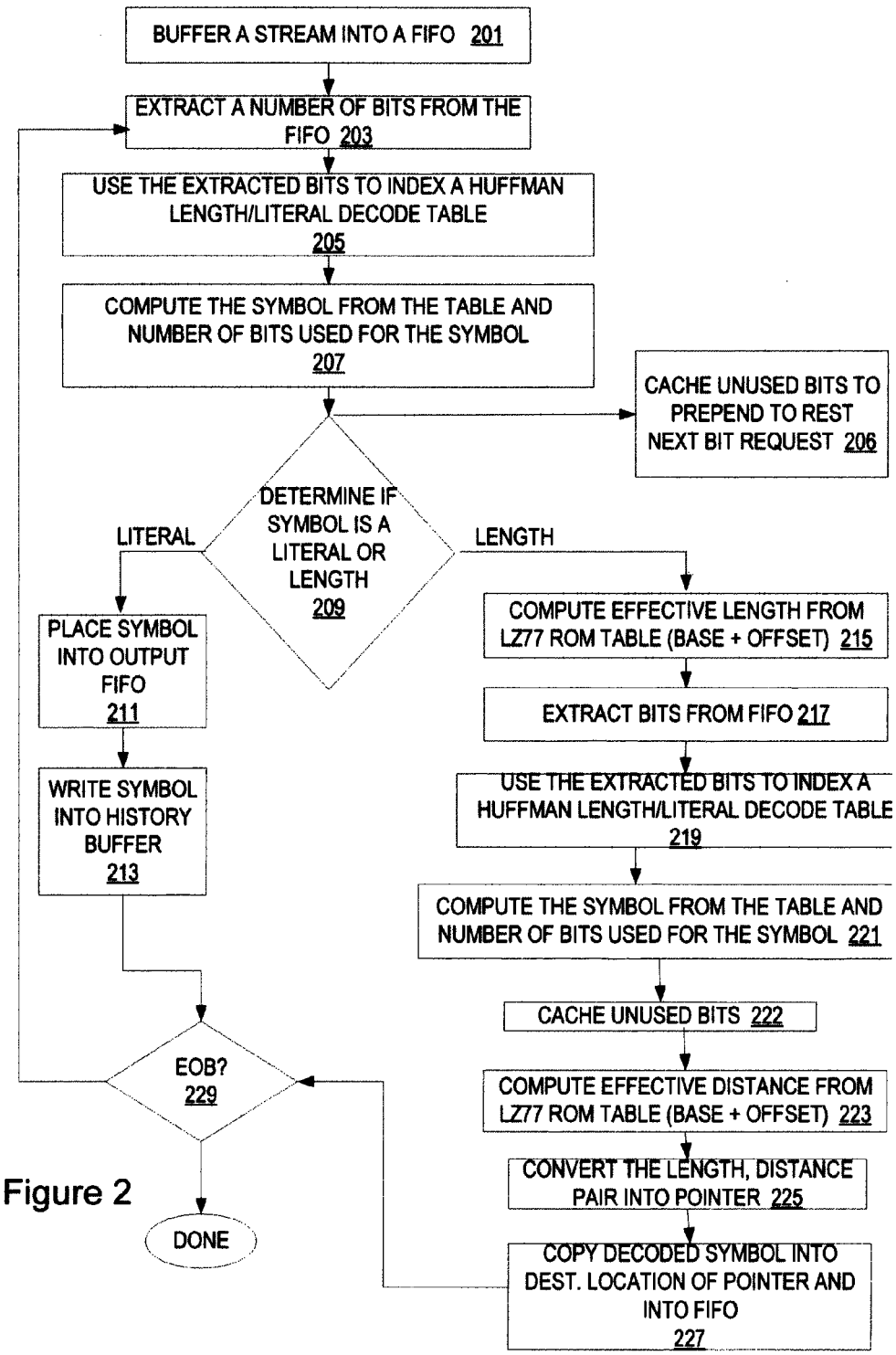
FIG. 2 illustrates an exemplary flow of a method for DEFLATE decompression using the components of FIG. 1.

FIG. 2 illustrates an exemplary flow of a method for DEFLATE decompression using the components of FIG. 1. At 201, the DEFLATE input stream, or at least a part thereof, is buffered into a FIFO queue such as the input FIFO queue 101. As more bits of the stream are available they are added to the FIFO space permitting.

At 203, a number of bits are extracted from the FIFO. The controller 109 causes the bit-extracting logic 103 to perform this extraction. These bits are passed to the controller 109 which is expecting either a length or literal code from the bit-extracting logic 103. The number of bits extracted does not need to be preset. In one embodiment, the number of bits extracted is seven. The extracted bits are used as an index into the Huffman length/literal decode table of the decoder 111 at 205. This table will provide a symbol and the number of input bits used for that symbol at 207. The symbol will also indicate whether it is a literal or length. If a smaller number of bits than those extracted were used for the coded symbol (for example, only four bits were used and not seven), then the controller caches the unused bits that were previously extracted at 206. This caching may be done inside of the controller or the bits may be placed back into the FIFO 101. These unused bits will be prepended to the next iteration of bits to be extracted.

A determination of if the symbol is a literal or length is made at 209. If the symbol is a literal, then it is placed into an output FIFO at 211. For example, a literal is decoded and sent from the decoder 111 (or controller 109) to the copy unit 107 which then sends the literal to the output FIFO 115. The literal is also written to the history buffer at 213. A determination of if this was the end-of-the-block (EOB) is made at 229. In an embodiment, the decoded symbol is an EOB symbol. If this was the last symbol, then the stream (or at least the block) has been decoded.

If the symbol was determined to be a length at 209, then an effective length is computed at 215. The LZ77 table for length (with 29 entries per the DEFLATE standard) provides a base length value and a number that signifies the number of extra bits to apply an offset. The effective length is the base plus offset. In an embodiment, the controller 109 performs this computation. The LZ77 table for length is illustrated as FIG. 4(a).

Because a length was decoded, the controller 109 expects a distance code from the input stream. A small number of bits are pulled from the FIFO (for example, five bits) at 217. The controller 109 causes the bit-extracting logic 103 to perform this extraction. Again, the number of bits extracted does not need to be set. The extracted bits are used as an index into the Huffman length/literal decode table of the decoder 111 at 219. This table will provide a symbol (distance) and the number of input bits used for that symbol at 221. If a smaller number of bits than those extracted were used for the coded symbol (for example, only four bits were used and not seven), then the controller caches the unused bits that were previously extracted at 222. This caching may be done inside of the controller or the bits may be placed back into the FIFO 101. These unused bits will be prepended to the next iteration of bits to be extracted.

At 223, a lookup into the LZ table for distance (with 30 entries per the DEFLATE standard) is made and an effective distance is computed. The LZ77 table provides a base distance value and a number that signifies the number of extra bits to apply an offset. The effective distance is the base plus offset. In an embodiment, the controller 109 performs this computation. The LZ77 table for distance is illustrated as FIG. 4(b).

The effective length, distance (<length, distance>) pair is converted into a pointer for the banks at 221. Each byte pointed to by the pointer is copied from that source byte location into a destination location (the current location for the new output stream data) of the history buffer and into the output FIFO at 223. The amount copied is determined by the length number of bytes from the pair. If the byte copying is parallelized, range overlap checking is performed to ensure that the source/destination pointers are not too close (in other words, if a large write of a lot of words is made, one should ensure that you read before you overwrite).

A determination of if this was the end-of-the-block (EOB) is made at 229. In an embodiment, the decoded symbol is an EOB symbol. If this was the last symbol, then the stream (or at least the block) has been decoded.

Figure 3:
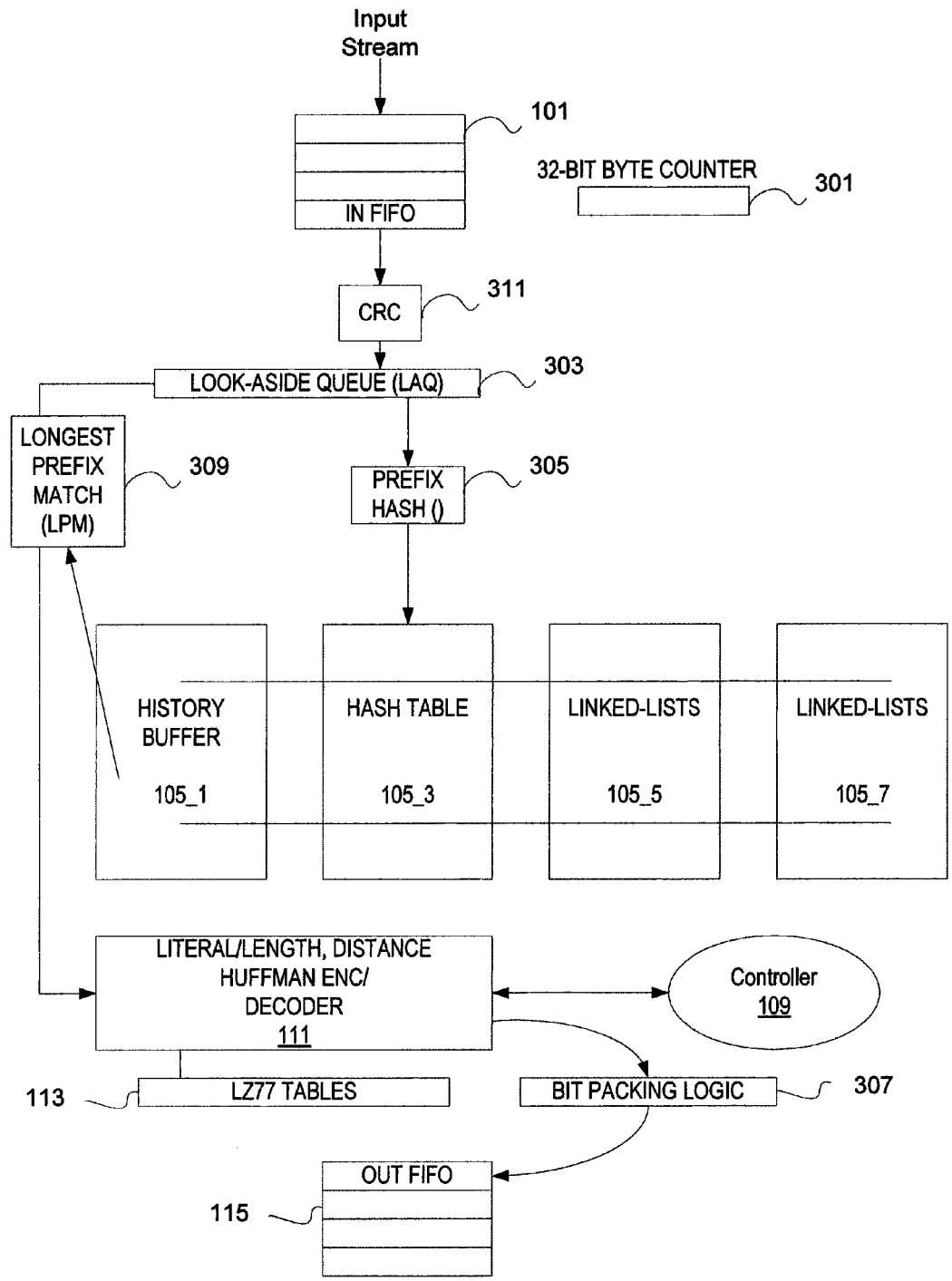
FIG. 3 illustrates an embodiment of components for performing data compression.

FIG. 3 illustrates an embodiment of components for performing data compression. In this embodiment, the components work together to perform DEFLATE compression, however, one or more of the components may be re-tasked such that the components perform another type of compression. Additionally, one or more of the components may be combined or further split up. Many of the components of FIG. 3 are common with FIG. 1 and as such, those components share the same numbering.

A 32-bit byte counter 301 is utilized in DEFLATE compression. This counter counts the number of input bytes that are added to a look-aside-queue (LAQ) 303. The LAQ 303 stores a fixed number of bytes from the input FIFO queue 101 and provides them to a hash function 305.

DEFLATE compression may also use cyclic redundancy check (CRC) as illustrated by CRC logic 311 to detect changes between the stream data and the entries of the LAQ. A longest prefix match routine 309 that determines the longest match between values stored in a history buffer and LAQ may be stored as a part of, or external to, the controller 109.

Figure 5A:
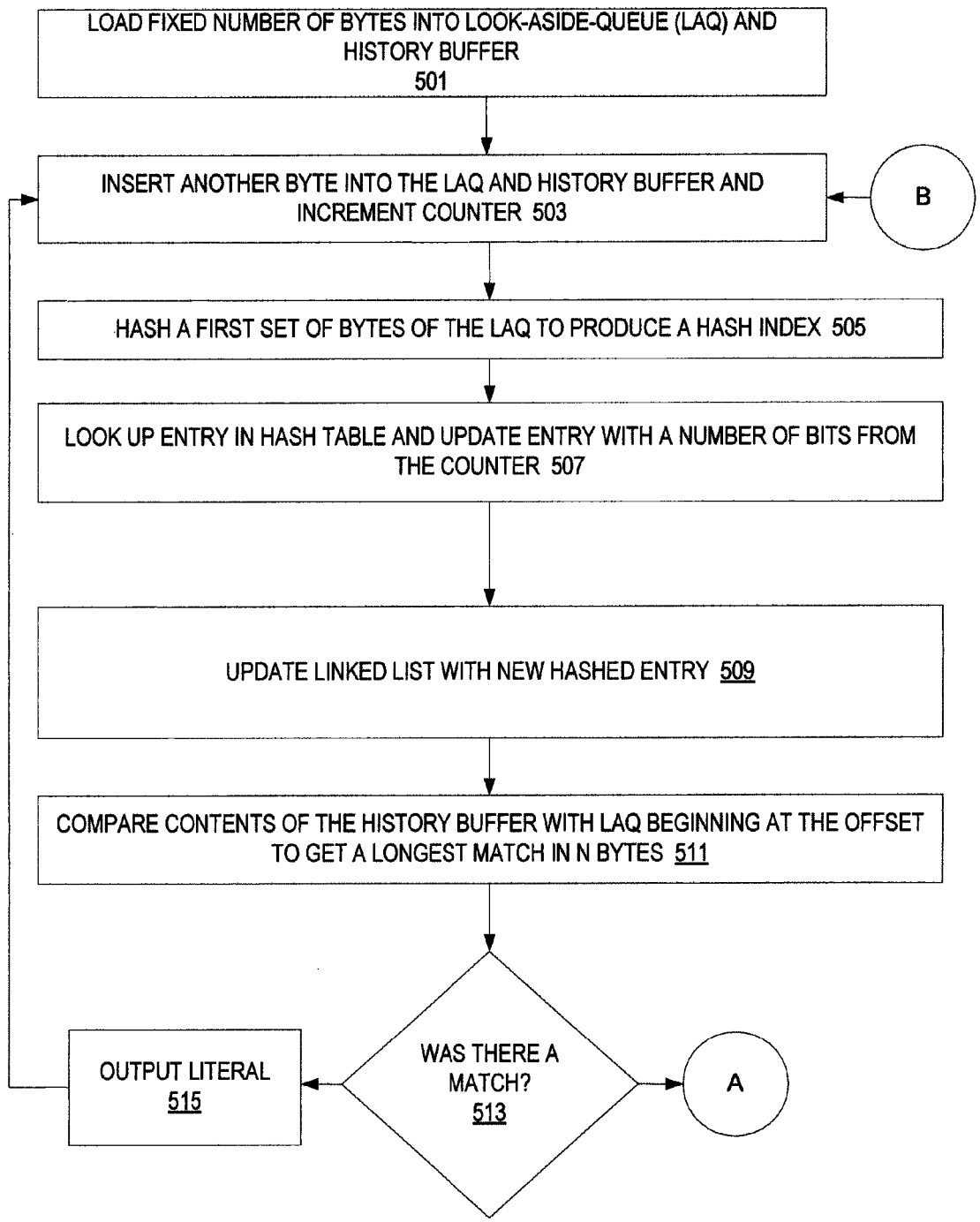
FIG. 5 illustrates an embodiment of a method for performing DEFLATE compression using the components of FIG. 3.
Figure 5B:
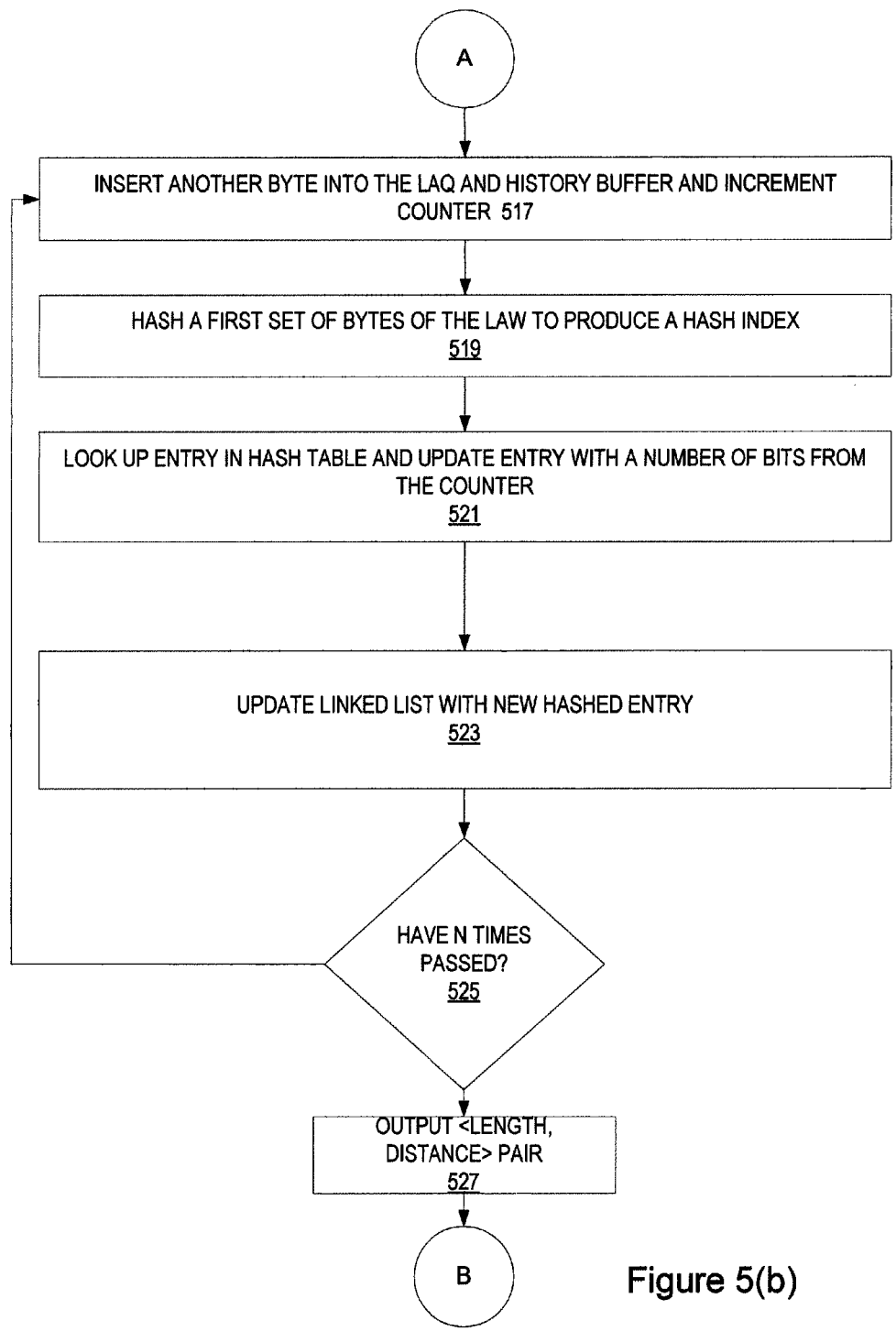

FIG. 5 illustrates an embodiment of a method for performing DEFLATE compression using the components of FIG. 3. At 501, a fixed number of bytes are loaded into the LAQ 303 and history buffer 105_1 from the input FIFIO 101. In an embodiment, the number of bytes is 16. The hardware of FIG. 3 uses read/write pointers to treat one of the banks as the history buffer. These pointers are typically maintained by the control logic 109. A CRC may also be performed.

Another byte is loaded from the input FIFO 101 into the LAQ 303 and history buffer 105_1 at 503. The counter 301 is also incremented.

A prefix hash is applied to a first set of bytes from the LAQ 303 to produce a hash index at 505. In some embodiments, the first set of bytes consists of the first three bytes in the LAQ 303. The hash index is typically 16 bits in size. The least significant bits of this hash index are used to lookup an entry in the hash table 105_03 at 507. The hash table 105_3 contains a set of head-pointers in linked-lists that are stored in 105_5 and 105_7. The linked-lists contain 16-bit pointers that represent relative offsets backward where the same prefixes were hashed in the history buffer 105_1. In an embodiment, the entries of the hash table 105_3 are 16-bits each and the hash table has 4 k entries (hence the twelve least significant bits of the hash are used as an index). The entry of the hash table 105_3 that was looked-up is updated with at least a portion of the current counter value. In an embodiment, the 16 least significant bits of the counter 301 are stored. This entry therefore represents the last count value when a prefix hashed into the hash table.

In some embodiments, the history buffer 105_1 is 8 KB and thus 8K pointers are needed. These are stored in the linked-lists 105_5 and 105_7. The linked-list is updated with the new hashed entry at the current location at 511. In some embodiments, the linked-list entries are maintained as a logical rotating queue of 8K entries.

If a search is made for the longest-prefix-match at the current location, the controller 109 initiates a sequence of string compare operations at each offset back from the head of the linked list through the use of a longest prefix match routine 309. This routine may be stored as a part of the controller 109 or external to the controller 109. The string compare operation reads the contents of the history buffer 105_1 and compares one or more bytes (such as 16 bytes) within the LAQ 303 and records the longest substring match in N bytes at 511. The controller 109 follows as many links as the system allows or prefers. For each new search, a new link is read by the controller 109 that turns into a cumulative relative distance from the head and then into an appropriate read pointer for the history buffer 105_1. The control logic 109 computes the difference between the count value that was read out and the current byte counter to determine a relative offset back from the current position where a similar substring may be located in the history buffer 105_1.

A determination of if there was a match at all by the string compares is made at 513. If there was no match, then the corresponding literal is output as the literal from the LAQ 303 did not appear in the history of the stream processing as was stored in the history buffer 103_1. In this instance, the LAQ 303 is shifted one byte position and the literal at the start of the prefix is "retired" from the stream and is read for being output. The literal is sent to the Huffman coder 111 and the corresponding encoded bits are sent to bit packing logic 307 and the output FIFO 115. The next byte is loaded into the LAQ 303 and history buffer 105_1 from the input FIFO 101 and the counter 301 is incremented.

If there was a match at 511, another byte is loaded from the input FIFO 101 into the LAQ 303 and history buffer 105_1 at 517. The counter 301 is also incremented.

A prefix is applied to a first set of bytes from the LAQ 303 to produce a hash index at 519. The least significant bits of this hash index are used to lookup an entry in the hash table 105_03 and the entry of the hash table 105_3 that was looked up is updated with at least a portion of the current counter value at 521. The control logic 109 computes the difference between the count value that was read out and the current byte counter to determine a relative offset back from the current position where a similar substring may be located in the history buffer 105_1. The linked-list is updated with the new hashed entry at the current location at 523. A determination of if 517 to 523 has occurred N times is made at 525. If no, then 517 to 523 are repeated. If yes, then a length, distance pair is sent to the Huffman coder 111 at 527. The length is N and the distance is the total relative offset in the history buffer. The Huffman coder has two parts: a first for length/literals and a second for distance. There may also be another part that collapses a sequence of <length, distance> pairs into a single entity. This is done prior to Huffman encoding. The output of the coder is sent to the bit packing logic 307 and output FIFO 115. At this point, the next byte is loaded into the LAQ, etc.

Typically, the hardware continuously flushes bits from the stream and pulls them into the history buffer 105_1, etc. in multiples of eight bytes when updating the bit/byte count of the output stream.

Figure 6:
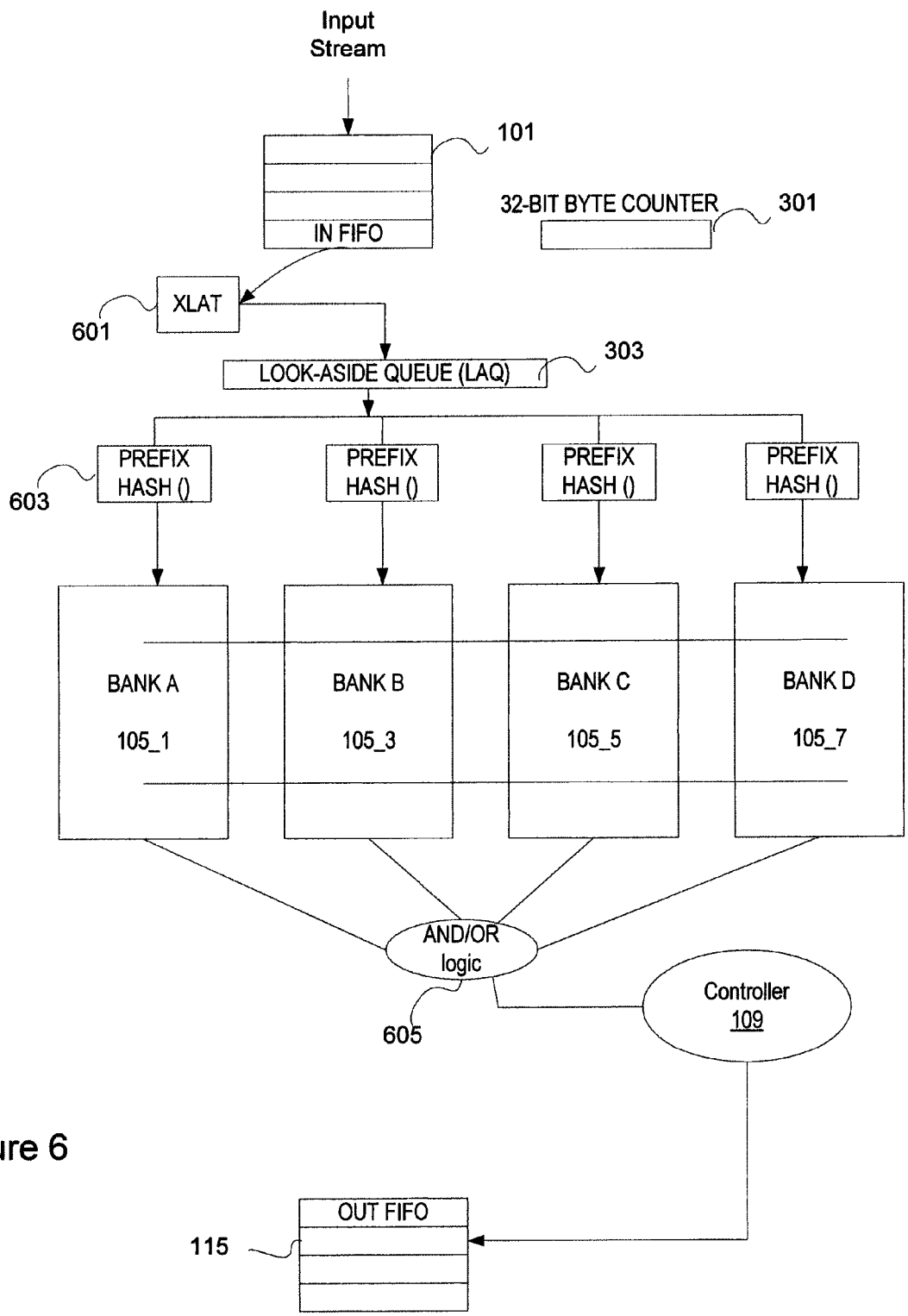
FIG. 6 illustrates an embodiment of a Bloom filter design that reuses some the previously described components.

FIG. 6 illustrates an embodiment of a Bloom filter design that reuses some the previously described components. However, a translator 601 to locate a byte entry in the banks, several more prefix hashes 603, and AND/OR logic 605 is added. This filter matches an input data stream in parallel against a large database of patterns. The banks 105 each provide a potential hit as a result of hashing with their associated hash function and the result is a hit if and only if all the banks 105 report a hit. This is a simplistic description of what the filter may accomplish and other filters are possible. A more detailed description of such a Bloom filter is described in pending application Ser. No. 12/346,734 which is herein incorporated by reference.

Figure 7:
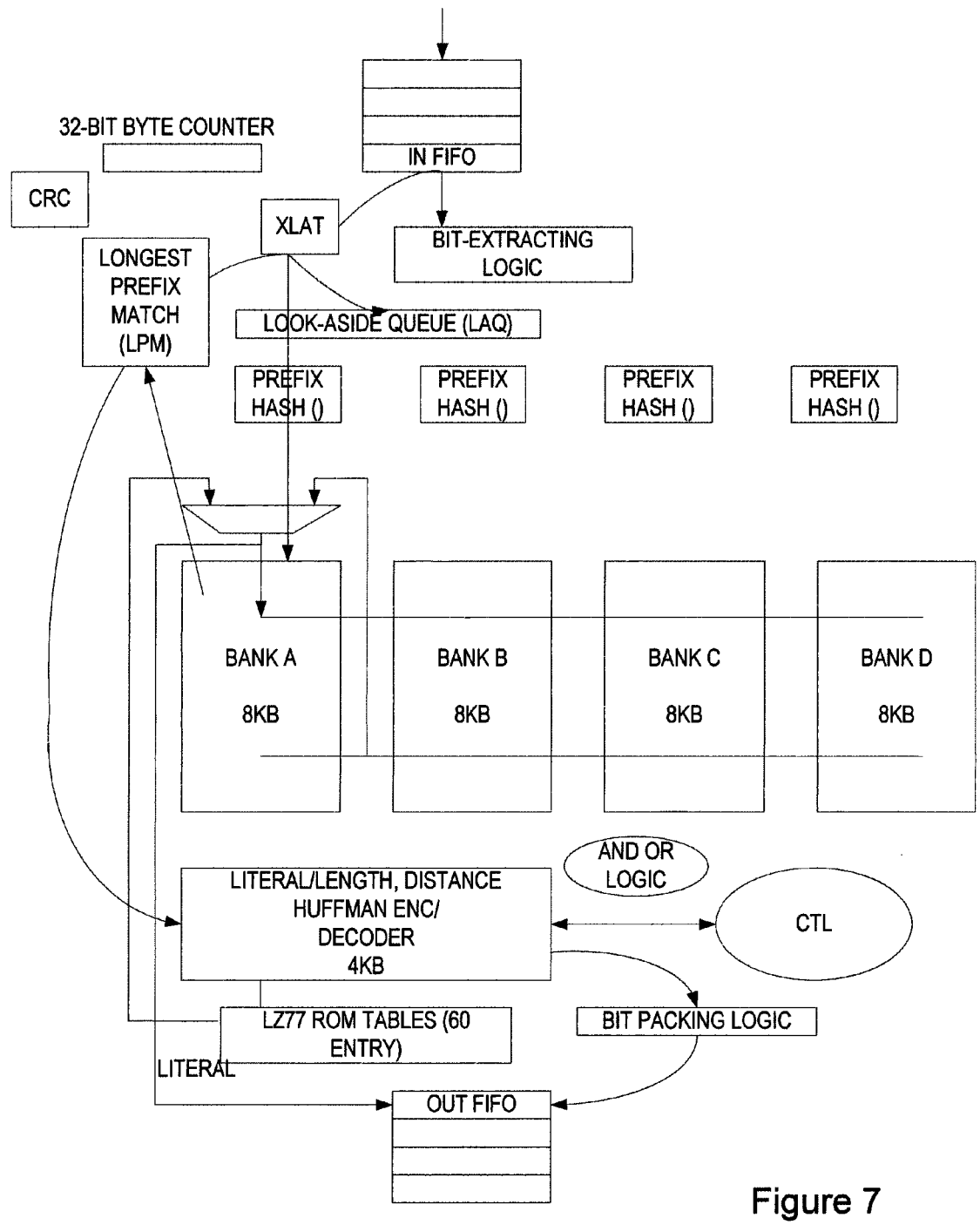
FIG. 7 illustrates an embodiment of all of the components of FIGS. 1, 3, and 6 together.

FIG. 7 illustrates an embodiment of all of the components of FIGS. 1, 3, and 6 together. These components may be in the same processing slice (processing core) or in a co-processor. While the following figures do not explicitly illustrate this, it should be understood that these figures may be modified, for example, to have one or more co-processors. The components may be hardware circuitry, software, or firmware. This framework is very scalable for other string processing tasks and is capable of supporting: LZ77, LZS, checksum calculations for the compression algorithms (CRC, Adler32), backup storage, filtering, and generic byte substitution that may be sued for case conversion. The framework maximizes component reuse thus saving resources.

Figure 8:
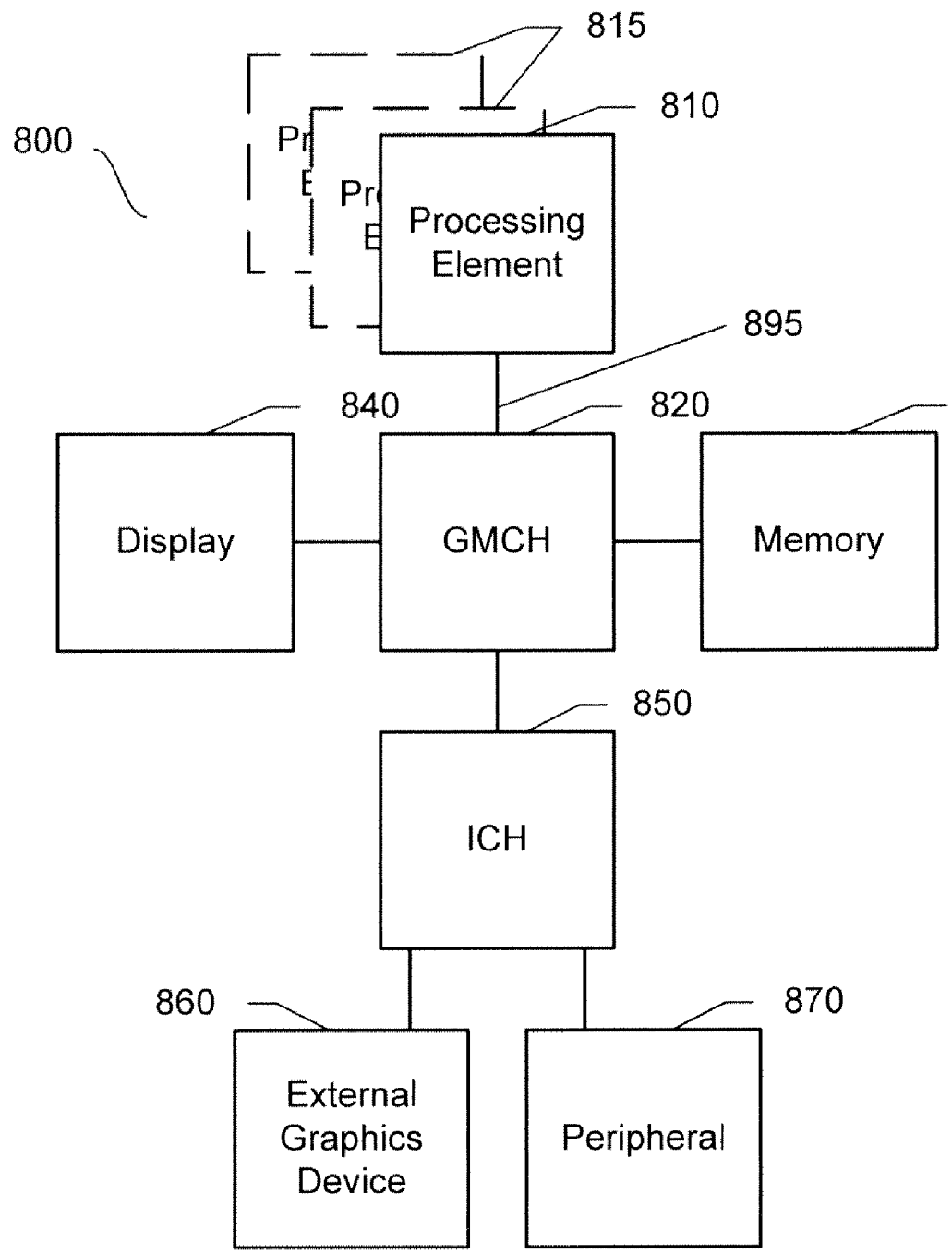
FIG. 8 is a block diagram of a system in accordance with one embodiment of the present invention

Referring now to FIG. 8, shown is a block diagram of a system 8 in accordance with one embodiment of the present invention. The system 800 may include one or more processing elements 810, 815, which are coupled to graphics memory controller hub (GMCH) 820. The optional nature of additional processing elements 815 is denoted in FIG. 8 with broken lines.

Each processing element may be a single core or may, alternatively, include multiple cores. The processing elements may, optionally, include other on-die elements besides processing cores, such as integrated memory controller and/or integrated I/O control logic. Also, for at least one embodiment, the core(s) of the processing elements may be multi-threaded in that they may include more than one hardware thread context per core.

FIG. 8 illustrates that the GMCH 820 may be coupled to a memory 840 that may be, for example, a dynamic random access memory (DRAM). The DRAM may, for at least one embodiment, be associated with a non-volatile cache.

The GMCH 820 may be a chipset, or a portion of a chipset. The GMCH 820 may communicate with the processor(s) 810, 815 and control interaction between the processor(s) 810, 815 and memory 840. The GMCH 820 may also act as an accelerated bus interface between the processor(s) 810, 815 and other elements of the system 800. For at least one embodiment, the GMCH 820 communicates with the processor(s) 810, 815 via a multi-drop bus, such as a frontside bus (FSB) 895.

Furthermore, GMCH 820 is coupled to a display 840 (such as a flat panel display). GMCH 820 may include an integrated graphics accelerator. GMCH 820 is further coupled to an input/output (I/O) controller hub (ICH) 850, which may be used to couple various peripheral devices to system 800. Shown for example in the embodiment of FIG. 8 is an external graphics device 860, which may be a discrete graphics device coupled to ICH 850, along with another peripheral device 870.

Alternatively, additional or different processing elements may also be present in the system 800. For example, additional processing element(s) 815 may include additional processors(s) that are the same as processor 810, additional processor(s) that are heterogeneous or asymmetric to processor 810, accelerators (such as, e.g., graphics accelerators or digital signal processing (DSP) units), field programmable gate arrays, or any other processing element. There can be a variety of differences between the physical resources 810, 815 in terms of a spectrum of metrics of merit including architectural, microarchitectural, thermal, power consumption characteristics, and the like. These differences may effectively manifest themselves as asymmetry and heterogeneity amongst the processing elements 810, 815. For at least one embodiment, the various processing elements 810, 815 may reside in the same die package.

Figure 9:
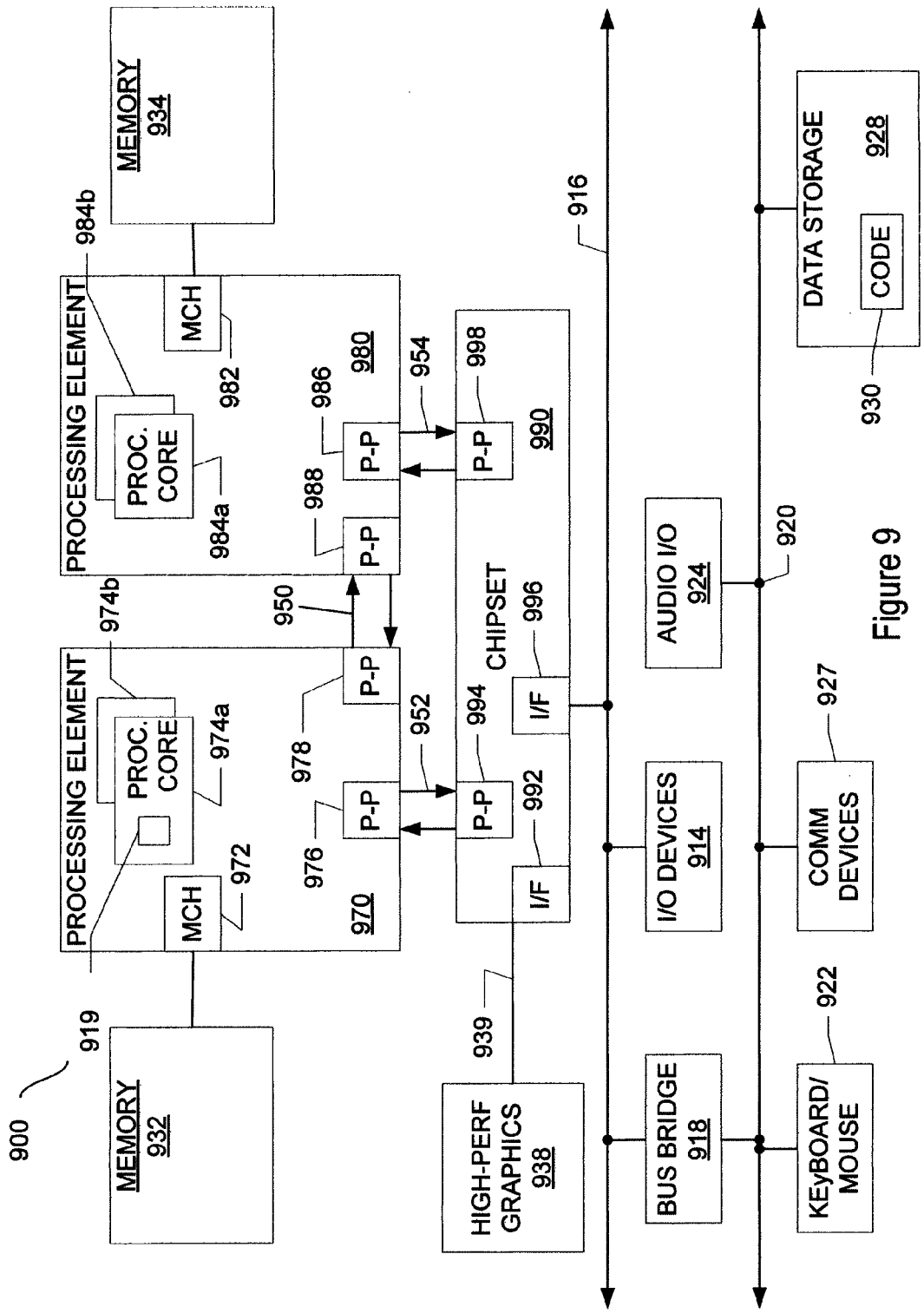
FIG. 9 is a block diagram of a system in accordance with an embodiment of the present invention.

Referring now to FIG. 9, shown is a block diagram of a second system 900 in accordance with an embodiment of the present invention. As shown in FIG. 9, multiprocessor system 900 is a point-to-point interconnect system, and includes a first processing element 970 and a second processing element 980 coupled via a point-to-point interconnect 950. As shown in FIG. 9, each of processing elements 970 and 980 may be multicore processors, including first and second processor cores (i.e., processor cores 974a and 974b and processor cores 984a and 984b).

Alternatively, one or more of processing elements 970, 980 may be an element other than a processor, such as an accelerator or a field programmable gate array.

While shown with only two processing elements 970, 980, it is to be understood that the scope of the present invention is not so limited. In other embodiments, one or more additional processing elements may be present in a given processor.

First processing element 970 may further include a memory controller hub (MCH) 972 and point-to-point (P-P) interfaces 976 and 978. Similarly, second processing element 980 may include a MCH 982 and P-P interfaces 986 and 988. Processors 970, 980 may exchange data via a point-to-point (PtP) interface 950 using PtP interface circuits 978, 988. As shown in FIG. 9, MCH's 972 and 982 couple the processors to respective memories, namely a memory 942 and a memory 944, which may be portions of main memory locally attached to the respective processors.

Processors 970, 980 may each exchange data with a chipset 990 via individual PtP interfaces 952, 954 using point to point interface circuits 976, 994, 986, 998. Chipset 990 may also exchange data with a high-performance graphics circuit 938 via a high-performance graphics interface 939. Embodiments of the invention may be located within any processor having any number of processing cores, or within each of the PtP bus agents of FIG. 9. In one embodiment, any processor core may include or otherwise be associated with a local cache memory (not shown). Furthermore, a shared cache (not shown) may be included in either processor outside of both processors, yet connected with the processors via p2p interconnect, such that either or both processors' local cache information may be stored in the shared cache if a processor is placed into a low power mode.

First processing element 970 and second processing element 980 may be coupled to a chipset 990 via P-P interconnects 976, 986 and 984, respectively. As shown in FIG. 9, chipset 990 includes P-P interfaces 994 and 998. Furthermore, chipset 990 includes an interface 992 to couple chipset 990 with a high performance graphics engine 948. In one embodiment, bus 949 may be used to couple graphics engine 948 to chipset 990. Alternately, a point-to-point interconnect 949 may couple these components.

In turn, chipset 990 may be coupled to a first bus 916 via an interface 996. In one embodiment, first bus 916 may be a Peripheral Component Interconnect (PCI) bus, or a bus such as a PCI Express bus or another third generation I/O interconnect bus, although the scope of the present invention is not so limited.

As shown in FIG. 9, various I/O devices 914 may be coupled to first bus 916, along with a bus bridge 918 which couples first bus 916 to a second bus 920. In one embodiment, second bus 920 may be a low pin count (LPC) bus. Various devices may be coupled to second bus 920 including, for example, a keyboard/mouse 922, communication devices 926 and a data storage unit 928 such as a disk drive or other mass storage device which may include code 930, in one embodiment. Further, an audio I/O 924 may be coupled to second bus 920. Note that other architectures are possible. For example, instead of the point-to-point architecture of FIG. 9, a system may implement a multi-drop bus or other such architecture.

Figure 10:
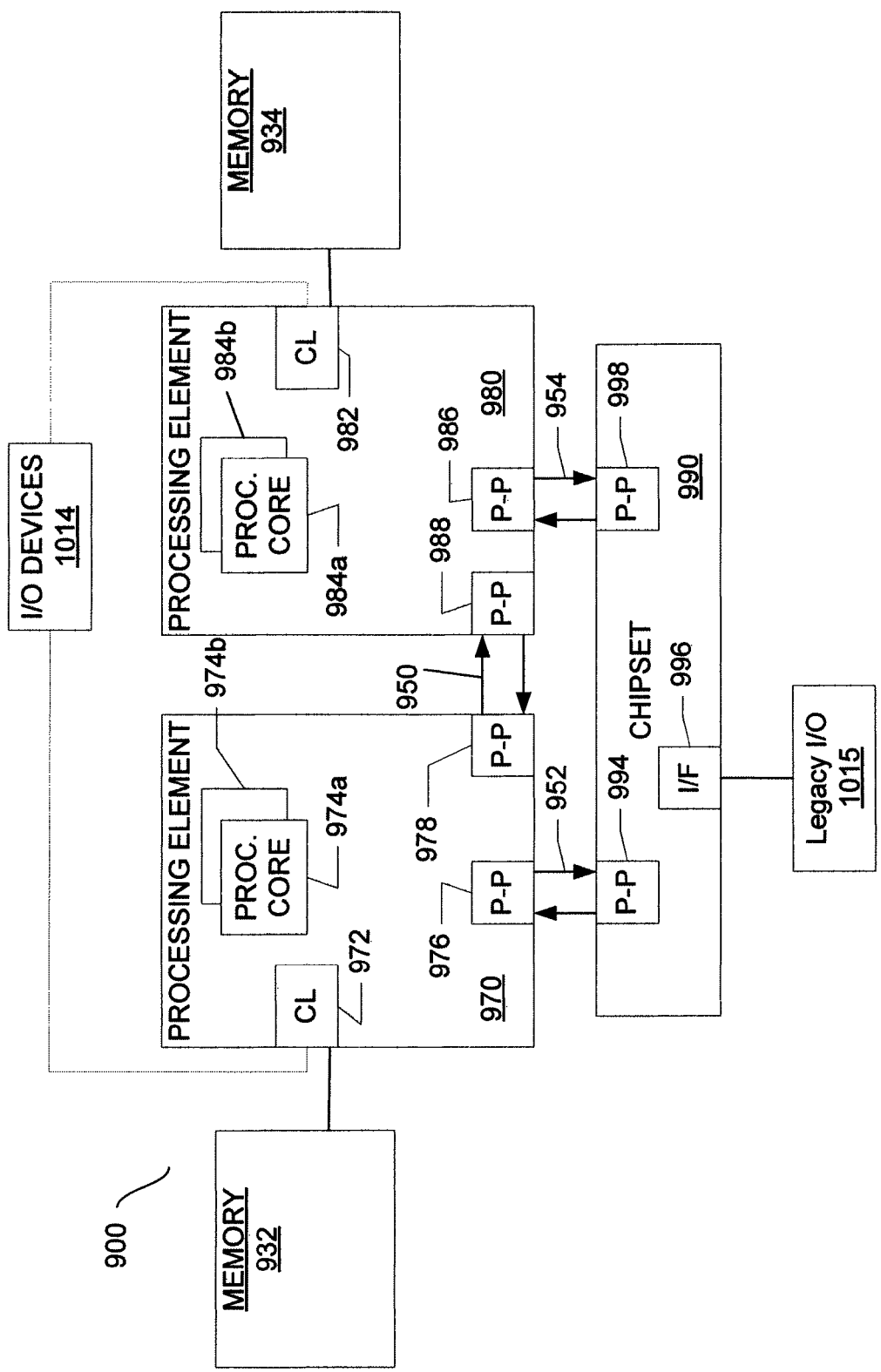
FIG. 10 is a block diagram of a system in accordance with an embodiment of the present invention.

Referring now to FIG. 10, shown is a block diagram of a third system 1000 in accordance with an embodiment of the present invention. Like elements in FIGS. 9 and 10 bear like reference numerals, and certain aspects of FIG. 9 have been omitted from FIG. 10 in order to avoid obscuring other aspects of FIG. 10.

FIG. 10 illustrates that the processing elements 970, 980 may include integrated memory and I/O control logic ("CL") 972 and 982, respectively. For at least one embodiment, the CL 972, 982 may include memory controller hub logic (MCH) such as that described above in connection with FIGS. 8 and 9. In addition. CL 972, 982 may also include I/O control logic. FIG. 10 illustrates that not only are the memories 942, 944 coupled to the CL 972, 982, but also that I/O devices 1014 are also coupled to the control logic 972, 982. Legacy I/O devices 1015 are coupled to the chipset 990.

Embodiments of the mechanisms disclosed herein may be implemented in hardware, software, firmware, or a combination of such implementation approaches. Embodiments of the invention may be implemented as computer programs executing on programmable systems comprising at least one processor, a data storage system (including volatile and non-volatile memory and/or storage elements), at least one input device, and at least one output device.

Program code, such as code 930 illustrated in FIG. 9, may be applied to input data to perform the functions described herein and generate output information. Accordingly, embodiments of the invention also include machine-readable media containing instructions for performing the operations embodiments of the invention or containing design data, such as HDL, which defines structures, circuits, apparatuses, processors and/or system features described herein. Such embodiments may also be referred to as program products.

Such machine-readable storage media may include, without limitation, tangible arrangements of particles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The programs may be implemented in a high level procedural or object oriented programming language to communicate with a processing system. The programs may also be implemented in assembly or machine language, if desired. In fact, the mechanisms described herein are not limited in scope to any particular programming language. In any case, the language may be a compiled or interpreted language.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents.

We claim:

1. An apparatus comprising:
   an input first in, first out (FIFO) buffer to store an input stream;
   a plurality of memory banks to store data from the input stream;
   a re-configurable controller to process the input stream, wherein the processes include at least decompressing and compressing the input stream; and
   an output FIFO buffer to store the processed input stream.

2. The apparatus of claim 1, further comprising:
   bit-extracting logic coupled to the input FIFO buffer, the bit extracting logic to extract bits from the FIFO to be decoded;
   a LZ ROM table to store LZ entries per a DEFLATE standard;
   a Huffman decoder to decode the bits extracted by the input FIFO buffer according to the DEFLATE standard into literals and lengths, wherein the re-configurable controller to compute an effective length and distance from the LZ ROM table from decoded lengths and generate read/write pointers into the plurality of memory banks; and
   a copy unit to copy decoded literals into the plurality of memory banks and the output FIFO buffer and copy bytes pointed to by the read/write pointers into the FIFO buffer.

3. The apparatus of claim 1, further comprising:
   a look-aside queue to store a fixed number of bytes from the input FIFO queue;
   a 32-bit byte counter count a number of input bytes that are added to the look-aside-queue;
   a hash function to generate a hash index into a hash table that contains a set of head-pointers in linked-lists, wherein a first memory bank of the plurality of memory banks is configured as the hash table and a second and third memory bank of the plurality is configured as the linked-lists; and
   a Huffman encoder encode literals from the LAQ and a history buffer, wherein the history buffer is a first memory bank of the plurality of memory banks and the re-configurable controller is configured to find matches in the history buffer and look-aside queue and provide those to the Huffman encoder.

4. The apparatus of claim 1, further comprising:
   a look-aside queue to store a fixed number of bytes from the input FIFO queue;
   a plurality of hash functions to generate hash indexes into the plurality of memory banks; and
   AND/OR logic to compare values associated with the hash indexes in the plurality of memory banks for a potential match between all of the memory banks; and
   wherein the re-configurable controller provides matching values from the AND/OR logic to the output FIFO.

5. The apparatus of claim 1, wherein each of the memory banks is 8 kB in size.

6. The apparatus of claim 3, further comprising:
   cyclic redundancy check logic to detect changes between the stream data and the entries of the look-aside queue.

7. A method of decompressing a stream comprising:
   extracting a first number of bits of a compressed input stream from an input buffer;
   indexing a Huffman length/literal decode table using at least a portion of the extracted bits to compute a symbol from the table, wherein the symbol is either a literal or length;
   if the symbol is a literal,
      outputting the symbol to an output buffer, and
      writing the symbol to a history buffer;
   if the symbol is a length,
      computing an effective length,
      extracting a second number of bits from the input buffer,
      indexing the Huffman length/literal decode table using at least a portion of the extracted bits to compute a symbol from the table wherein the symbol is a distance,
      computing an effective distance from the distance, and
      copying a number of bytes equal to the effective length into the history buffer and output buffer; and
   outputting a decompressed stream from the output buffer.

8. The method of claim 7, further comprising:
   caching bits of the first number of bits that were not used to index the Huffman length/literal decode table to be prepended to the second number of bits.

9. The method of claim 7, wherein computing the effective length comprises:
   accessing a LZ77 table with entries for length to retrieve a base length value and a number that signifies the number of extra bits to apply as an offset; and
   adding the offset to the base length value to create the effective length.

10. The method of claim 9, further comprising
    caching bits of the fixed number of bits that were not used to index the Huffman length/literal decode table to be prepended to a subsequent request for bits from the input buffer.

11. The method of claim 7, wherein computing the effective distance comprises:
    accessing a LZ77 table with entries for distance to retrieve a base distance value and a number that signifies the number of extra bits to apply as an offset; and
    adding the offset to the base distance value to create the effective distance.

12. The method of claim 7, wherein the history buffer is 32 kB in size.

13. The method of claim 7, further comprising:
    buffering the compressed input stream into the input buffer.

14. A method of compressing a stream of data comprising:
    inserting a byte of the stream of data into a look-aside queue and a history buffer;
    updating a counter to reflect the insertion;
    hashing a first set of bytes from the look-aside queue to generate a hash index;
    accessing an entry of a hash table using the hash index, wherein the entry of the hash table is a pointer to an entry of a linked list and each entry of the linked list is a relative offset of when the first set of bytes was previously hashed in the history buffer;
    updating the entry of the hash table to reflect to represent a count value from when the first set of bytes was hashed into the hash table;
    comparing contents of the history buffer with the look-aside queue beginning at the history buffer location associated with the relative offset of the linked list entry associated with the hash table entry to determine N number of matching prefixes;
    if N is zero, outputting a literal at the start of the prefix;
    if N is greater than zero, outputting a length, distance pair, wherein the length is N and the distance is the total relative offset in the history buffer; and
    encoding any output literal and length, distance pairs.

15. The method of claim 14, wherein the count value is sixteen least significant bits of the counter.

16. The method of claim 14, wherein outputting the N matching literals further comprises:

performing N times,
  inserting another byte from the input stream into the look-aside queue and history buffer;
  updating the counter to reflect the insertion;
  hashing a set of bytes from the look-aside queue to generate a hash index;
  accessing an entry of the hash table using the hash index;
  updating the entry of the hash table to reflect to represent the count value from when the set of bytes was hashed into the hash table; and
outputting the length, distance pair.

17. The method of claim 14, wherein the history buffer is a first memory bank, the hash table is a second memory bank, and the linked list is a third and fourth memory bank.

18. The method of claim 17, wherein each of the memory banks is 8 kB in size.

19. The method of claim 14, further comprising:
  inserting a byte from the stream into the look-aside queue and history buffer; and
  incrementing the counter.

* * * * *